(12) United States Patent
Kikuchi

(10) Patent No.: US 6,960,258 B2
(45) Date of Patent: Nov. 1, 2005

(54) DISCHARGE DEVICE AND DISCHARGE METHOD

(75) Inventor: Katsumi Kikuchi, Aomori (JP)

(73) Assignee: Fujitsu Media Devices Limited, Yokohama (JP)

( * ) Notice: Subject to any disclaimer, the term of this patent is extended or adjusted under 35 U.S.C. 154(b) by 279 days.

(21) Appl. No.: 10/267,667

(22) Filed: Oct. 10, 2002

(65) Prior Publication Data

US 2003/0089795 A1 May 15, 2003

(30) Foreign Application Priority Data

Nov. 9, 2001 (JP) ........................................ 2001-344083

(51) Int. Cl.⁷ .................................................. B65D 5/72
(52) U.S. Cl. ........................ 118/200; 222/501; 401/148
(58) Field of Search ................................ 118/222, 200, 118/205, 300; 222/501, 518; 401/148

(56) References Cited

U.S. PATENT DOCUMENTS 4,461,408 A * 7/1984 Shepard ...................... 222/501
4,812,071 A * 3/1989 Batra et al. .................. 401/264

* cited by examiner

Primary Examiner—Fred J. Parker
(74) Attorney, Agent, or Firm—Arent Fox PLLC

(57) ABSTRACT

By means of a fluid material discharge device of simple construction, a technique for fluid material discharge is provided which has few or no inadequate discharge, high productivity, and which enables easy modification and adjustment of the amount of fluid material discharge. The fluid material discharge device comprises a nozzle for discharge of fluid material and a filament-shape member inserted into the nozzle for use. The filament-shape member has a tip portion AA, which is exposed outside of the nozzle when no pressure is exerted on the tip of the filament-shape member, a portion BB which can be inserted into the nozzle, and a portion CC, on the side of the filament-shape member opposite the tip portion AA, and being bent from the portion BB. The spring structure of the filament-shape member is utilized to discharge fluid material.

9 Claims, 7 Drawing Sheets

FIG. 11
FIG. 12
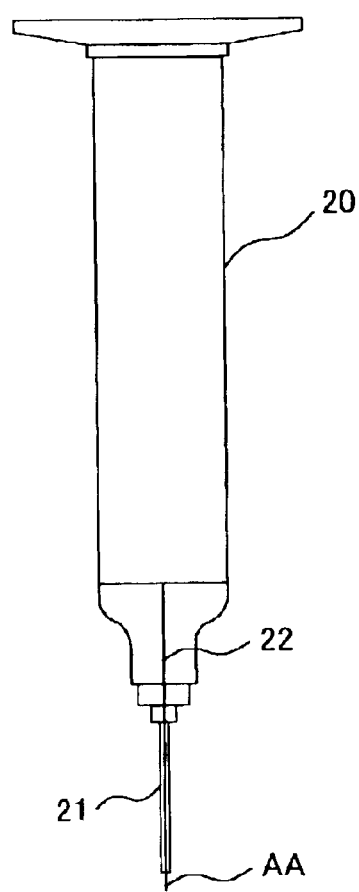
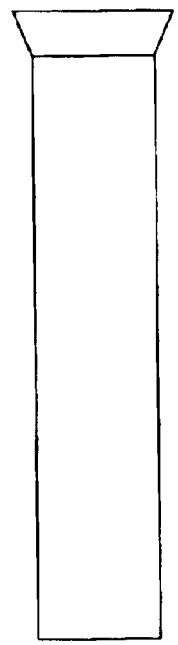

DISCHARGE DEVICE AND DISCHARGE METHOD

BACKGROUND OF THE INVENTION

1. Field of the Invention

This invention relates to a fluid material discharge device and discharge method. In particular, this invention relates to a dense fluid material discharge device and discharge method, regarding a paste dispenser used to apply a paste, of which the bonding paste used for bonding a semiconductor chip to a lead frame is representative.

2. Description of the Related Art

In electronics fields, a dispenser having as the principal component a discharge device 1, comprising a fluid material holder 2 and a nozzle 3 connected to the fluid material holder 2 as shown in FIG. 1, is known for a method to supply paste for use in bonding to, for example, a lead frame.

In the discharge device of FIG. 1, often the paste in the fluid material holder 2 is pushed out from the tip of the nozzle 3 by the force of pressurized gas supplied from a pressurized gas supply aperture 4.

Normally dispensers use cylindrical-shape needle nozzles with hollow interiors; discharge from the tip is controlled by setting the amount of pressure applied to the syringe interior, which is the fluid material holder, and the time duration of pressure application.

When applying a fixed amount of a paste containing silver filler or similar using a dispenser, if a widely used needle nozzle is employed, inadequate discharge (that is, discharge in which an inadequate amount or no amount is discharged) sometimes occur due to liquid clogging within the needle nozzle, and due to the fact that air bubbles which have remained owing to inadequate defoaming, contract when the paste is pressurized, and absorb the pressure applied.

For paste which is difficult to control owing to poor flowability, what is called a precision nozzle, with a conical taper formed in the interior of the nozzle, has been commercialized; though flowability is improved somewhat, the cost is prohibitive at some 20 times or more that of a conventional needle nozzle, and in addition high positioning precision with the object for application is required, so that the problems in question are not completely alleviated.

For highly viscous paste, a screw or other component is incorporated between the syringe and the nozzle, in a certain commercialized product type which forcibly discharges the fluid material; this is also expensive, however, and maintenance is required.

Japanese Utility Model Publication No. S59-36306 discloses a discharge device 5 which, as shown in FIG. 2, comprises a fluid material holder 6; nozzle 7; core wire 8 somewhat smaller than the inner diameter of the nozzle tip, inserted into the nozzle; and spring 9, enabling the core wire 8 to move vertically within the nozzle 7.

In this device, the fluid material is not discharged outside the nozzle by pressure, but is discharged by the action of the following cycle.

(1) Under the action of the spring 9, a portion of the core wire 8 in the nozzle moves outside the nozzle, and by this means the fluid material is extracted from the nozzle.

(2) When the nozzle 7 is pressed against an adherend (in this specification, the object onto which the fluid material is caused to adhere is called the adherend), the fluid material between the nozzle tip and the core wire 8 is scraped away, forming a flat shape on the adherend.

(3) Next, as the nozzle 7 is withdrawn from the adherend, the fluid material on the adherend retains a flat shape and remains on the adherend.

(4) Under the action of the spring 9, a portion of the core wire 8 within the nozzle again moves outside the nozzle, and by this means the fluid material is extracted. In other words, the above step (1) is repeated.

The above invention has as an object the ability to cause the fluid material remaining on the adherend to be flat rather than hemispherical, so that during bonding the chip or other object to be bonded can be fixed in a normal position.

However, this invention makes no suggestions regarding the prevention of inadequate discharges.

Also, because the construction of the spring or other parts in the device is complex, it is difficult to further provide other means for the discharge of fluid material, such as providing a path for intake of pressurized gas.

In the above publication, as indicated by the expression "core wire somewhat smaller than the inner diameter of the nozzle tip", in the above process (2), the gap between the nozzle tip and the core wire 8 must be made small in order to perform the scraping-off.

The amount of fluid material discharged is greatly influenced by the gap, the viscosity and thixotropic properties of the fluid material, the speed of the above cycle, etc.; the viscosity and thixotropic properties of the fluid material fluctuate according to variation in the quality of the fluid material, the temperature of the fluid material, and other factors, and so there is the problem that, in order to maintain a constant fluid material discharge amount while keeping production speed in a fixed range (holding constant the above cycle), the size of the core wire 8 and size of the nozzle must frequently be changed in a delicate manner.

SUMMARY OF THE INVENTION

One object of this invention is to provide a fluid material discharge technique which, by means of a fluid material discharge device of simple construction, results in no or few inadequate discharges, affords high productivity, and enables the easy modification and adjustment of the amount of discharge of fluid material.

Further objects and advantages of this invention will become apparent through the explanation below.

One aspect of this invention is a fluid material discharge device comprising a nozzle for discharge of fluid material, and a filament-shape member inserted into the nozzle for use, wherein the filament-shape member has:

a tip portion AA, which is exposed outside the nozzle when no pressure is exerted on the tip of the filament-shape member;

a portion BB which can be inserted into the nozzle; and, a portion CC, on the side of the filament-shape member opposite the tip portion AA, and being bent from the portion BB.;

Another aspect of this invention is a fluid material discharge method, using the above discharge device, and having:

a stage in which the tip of the above filament-shape member, which is in a state of non-contact with the above adherend is brought into pressure contact with the adherend, and the nozzle is brought into proximity to the adherend, so that the fluid material is made to move onto the adherend, while the tip portion AA is made to move into the above nozzle from outside; and a stage in which the pressure contact of the tip of the filament-shape member with the adherend is relaxed, and the nozzle is moved in a direction away from the adherend, so that a prescribed amount of the fluid material is made to remain on the adherend, while at the same time the bending of the portion CC causes the tip portion AA to be moved outside from the inside of the above nozzle and makes part of the fluid material to move to the outside of the nozzle.

By causing the filament-shape member to move within the nozzle by means of bending, that is, a simple bent-shape construction, the fluid material can be smoothly extracted.

This leads to improved productivity, and also to the prevention of the above-mentioned inadequate discharge.

By adopting the simple construction of a bent shape, a pressurizing device can also be used to discharge a fluid material in the course of discharge, so that the amount of discharge of a fluid material can be easily changed according to the purposes of manufacture.

Further, by using a pressurizing device to discharge a fluid material together with the present technology, fluctuations in the amount of discharge can be prevented, and adjustment of the discharge amount becomes easy.

Further features of the present invention will become evident through the following explanation of aspects of the invention and through the drawings.

BRIEF DESCRIPTION OF THE DRAWINGS

FIGS. 11 and 12 are diagrams to explain a method for assembly of a fluid material discharge device of this invention; FIG. 11 shows a fluid material holder to which are attached a filament-shape member and a nozzle, and FIG. 12 shows a jig for insertion of the filament-shape member.

DESCRIPTION OF THE PREFERRED EMBODIMENTS

Figure 1:
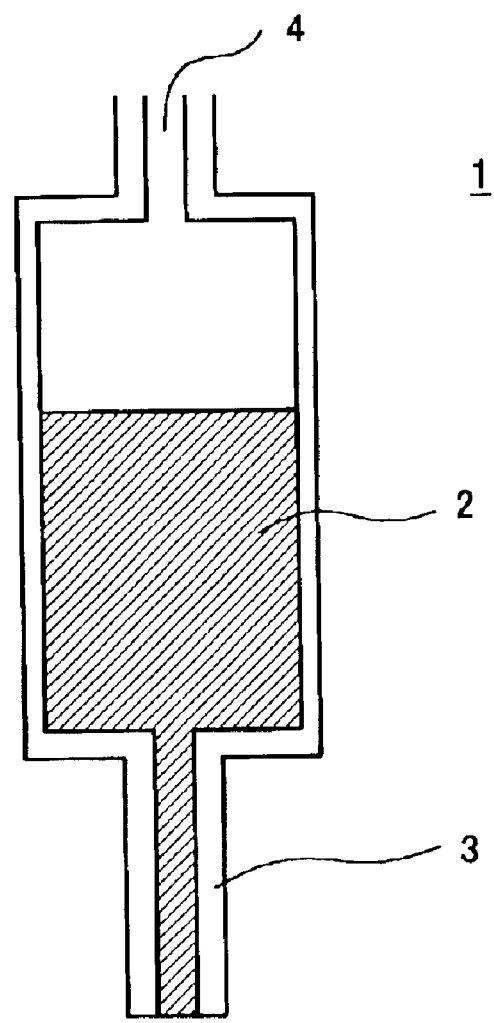
FIG. 1 shows a discharge device, comprising a fluid material holder and a nozzle connected to the fluid material holder.
Figure 2:
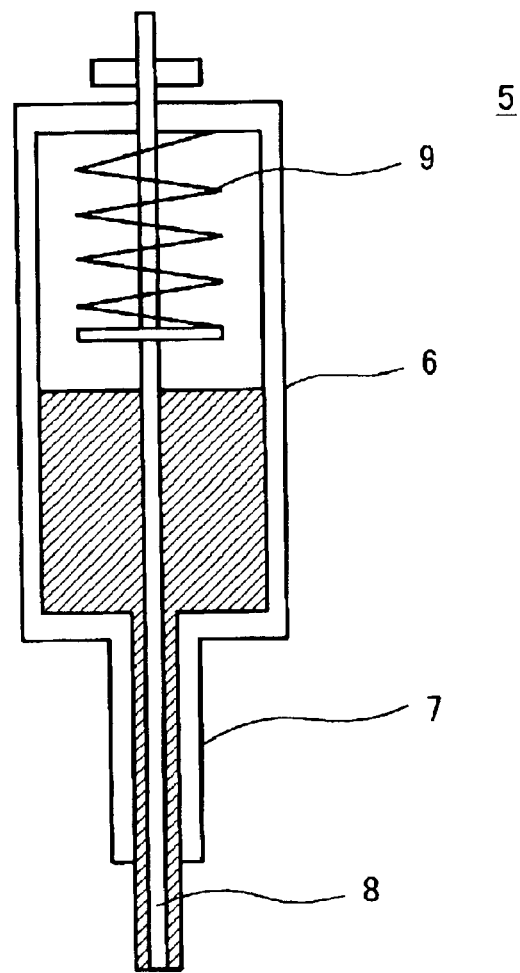
FIG. 2 shows a known discharge device, comprising a fluid material holder, nozzle, core wire inserted into the nozzle, and spring.

Below, aspects of this invention are explained using figures and embodiments. The drawings, embodiments, and explanations are meant as illustrations of the invention, and do not limit the scope of the invention. It is needless to say that other aspects also fall within the scope of this invention, so long as they conform to the gist of the invention. The same components may in some cases be assigned the same symbols in the drawings.

Figure 3:
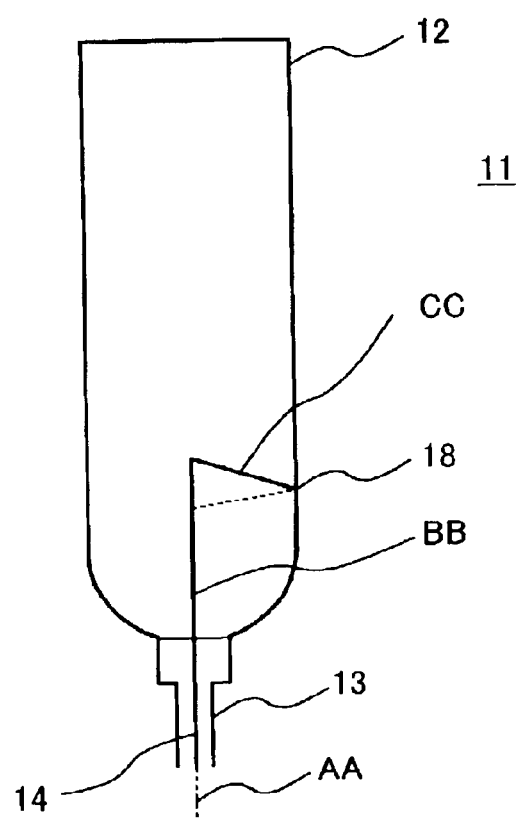
FIG. 3 shows one example of a discharge device of this invention.

FIG. 3 shows a discharge device 11 of this invention.

In FIG. 3, the filament-shape member 14 passes through the interior of the nozzle 13, to reach the fluid material holder 12.

One portion of this filament-shape member 14 is outside the nozzle 13, as shown by the tip portion AA (dotted line); the other end is bent, as shown by the portion CC (dotted line).

This bending brings about a spring action, so that when the tip of the filament-shape member 14 is pressed against some object, the tip portion AA moves into the nozzle 13 due to deformation as shown by the solid line portion of the filament-shape member 14 in FIG. 3, and when the pressing is halted, the tip portion AA and the portion CC move to the positions indicated by the dotted lines, and the tip portion AA again protrudes outside the nozzle 13.

Figure 4:
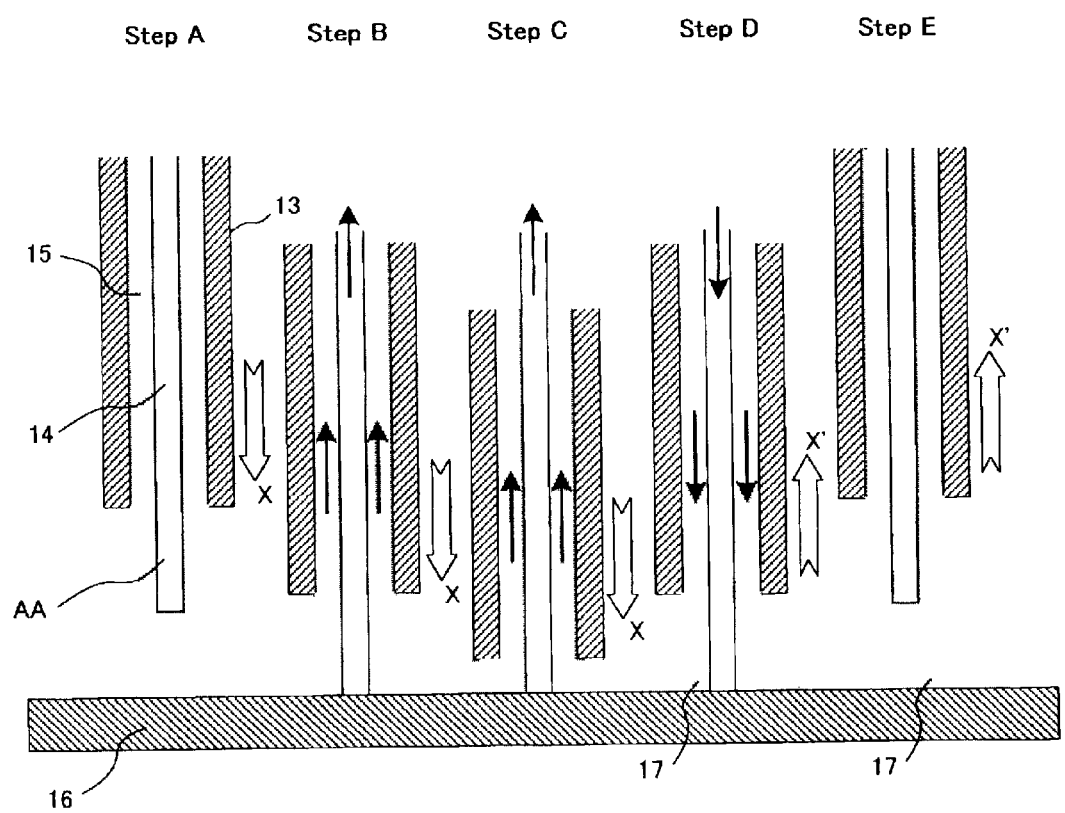
FIG. 4 shows the actions of a discharge device of this invention, in which steps A through E each show a stage of these actions.

These actions are further explained using FIG. 4.

In FIG. 4, steps A through E show stages of these actions. Symbols are assigned primarily in A, whereas symbols in the same places may be omitted in B through E.

The actions are as follows.

(1) As shown in FIG. 4, step A, action begins from a state in which the fluid material 15 adheres to the tip portion AA of the filament-shape member 14 inserted into the nozzle 13. In this state, the filament-shape member 14 is not in contact with the adherend 16. The nozzle 13 is then moved in the X direction, that is, in the direction toward the adherend 16.

(2) FIG. 4, step B shows an intermediate state, while the nozzle 13 is moving in the X direction after the tip of the filament-shape member 14 has come into contact with the adherend 16. The fluid material has a tendency to swell somewhat upon exiting the nozzle, and in many cases the viscosity increases in the non-flowing state because the fluid material has thixotropic properties. Accordingly, the fluid material is scraped from the filament-shape member 14 and falls in the downward direction as shown in the figure.

After the tip of the filament-shape member 14 comes into contact with the adherend 16, the spring action by the bending causes deformation of the portion CC of the filament-shape member 14 as shown by the solid line in FIG. 3, and the tip portion AA moves into the nozzle 13.

At this time, the filament-shape member 14 is in pressure contact with the adherend 16, and the fluid material adheres to the adherend 16. However, a portion of the fluid material flows back in the direction toward the fluid material holder 12, through the space between the nozzle 13 and the filament-shape member 14.

When the fluid material has thixotropic properties, this backflow is accelerated by a decrease in viscosity as the fluid material flows in relative motion between the nozzle 13 and the filament-shape member 14.

As a result of studies, it was found that this backflow plays the role of a buffer from the changes in the amount of fluid material discharged, reducing fluctuations in the amount of discharge of the fluid material.

The backflow amount can be adjusted through various factors such as the speed of relative motion of the nozzle 13 and the filament-shape member 14, the distance between the nozzle 13 and filament-shape member 14, and the cross-sectional areas.

(3) Then, as shown in FIG. 4, step C, when the filament-shape member 14 is brought into pressure contact with the adherend 16, and the tip of the nozzle 13 is brought into proximity to the adherend 16, the fluid material 15 on the adherend 16 is pressed and squashed, so as for example to become flat.

"The nozzle is brought into proximity to the adherend" in this invention means that the nozzle is brought into sufficient proximity, with a result that the fluid material is pressed and squashed in this manner.

(4) Then, as shown in FIG. 4, step D, the pressure contact of the tip of the filament-shape member 14 with the adherend 16 is relaxed, and the nozzle 13 is moved in the X' direction, that is, in the direction away from the adherend 16. Accordingly, a prescribed amount of the fluid material is transferred onto the adherend 16, and remains as the remaining fluid material 17. As the pressure contact of the tip of the filament-shape member 14 with the adherend 16 is relaxed, the tip portion AA again moves outside the nozzle 13. This motion is accompanied by movement outside the nozzle 13 of fluid material 15, in a state of adhesion to the tip portion AA.

(5) Then, as shown in FIG. 4, step E, the tip portion AA separates from the remaining fluid material 17, and the state of FIG. 4, step A is restored.

To realize the above actions, it was judged that the above-described bending is sufficient for a spring construction.

As means to fix the filament-shape member 14 in place, it is effective to provide a depression 18 or the like to hold the portion CC in the fluid material holder 12, as shown in FIG. 3.

Figure 5:
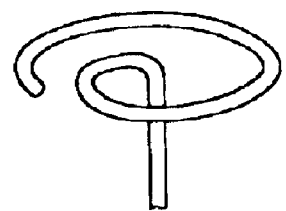
FIG. 5 shows an example of part of a filament-shape member of this invention, having a portion CC with a coil-spring structure.
Figure 6:
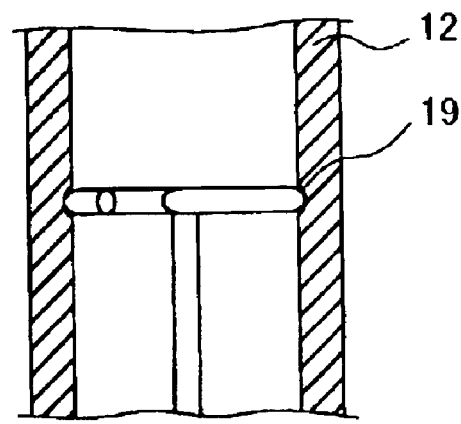
FIG. 6 shows an example of a depression for installation of the filament-shape member.
Figure 7:
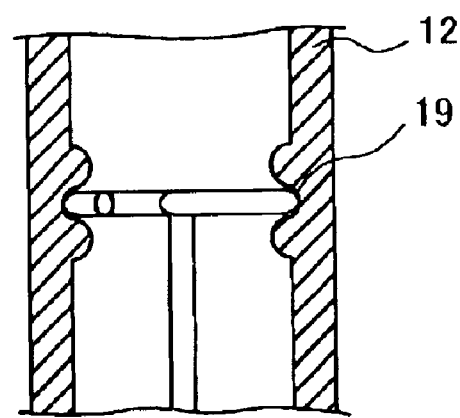
FIG. 7 shows another example of a depression for installation of the filament-shape member.

As shown in FIG. 5, it is also effective to endow the portion CC with a coil-spring structure, and to provide a depression 19 or the like in the fluid material holder 12, as shown in FIGS. 6 and 7.

In all of the above cases, it is possible to insert the filament-shape member 14 into the fluid material holder 12 from the side opposite the nozzle 13.

Because the depression can be fabricated with relative ease, and the filament-shape member can be held with high reliability, the methods shown in FIGS. 5, 6 and 7 are preferable.

As examples of the dimensions of such a discharge device, the fluid material holder 12 may have a circular cross-section, of diameter 10 to 30 mm, and with a volume of 5 to 50 mL; the nozzle 13 may be circular, with a cross-sectional interior diameter of 0.3 mm to 1.2 mm; and the filament-shape member 14 may be a solid member and may have a circular cross-section of diameter 0.1 mm to 0.8 mm.

As the materials for the fluid material holder 12, nozzle 13 and filament-shape member 14, any known material can be used, including metals, plastics, ceramics, and composites of these, so long as the essence of this invention is satisfied.

The filament-shape member may be of any material to which the fluid material can be made to adhere, which is effectively inactive with respect to the fluid material, and which does not effectively buckle during motion within the nozzle.

However, it is preferable that the filament-shape member, and more precisely at least the portion CC of the filament-shape member be formed from an elastic body to exhibit a spring action.

It is also preferable, from the standpoints of processability and reliability, that the above portions AA, BB and CC of the filament-shape member itself be of a single body formed from the same material.

As the elastic body, metals, plastics, or various other materials can be used. Among them, glass fibers, carbon fibers, and steel wire can be cited as preferred examples, because it is an important factor to withstand a certain amount of stress.

Figure 8:
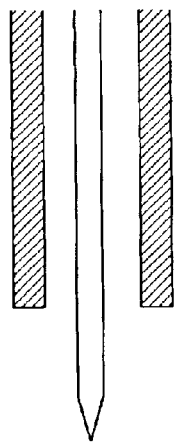
FIG. 8 shows a cross-sectional construction of part of a filament-shape member having a conical-shape tip.
Figure 9:
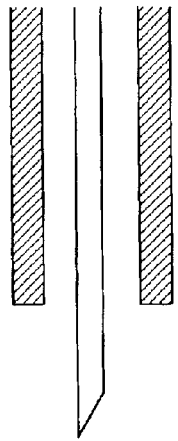
FIG. 9 shows a cross-sectional construction of part of another filament-shape member having a tip construction in which a cylinder is cut diagonally.

With respect to the above portion AA, it is preferable that the tip be tapered, as for instance shown in FIGS. 8 and 9. This is because when the tip portion AA retreats from the remaining fluid material 17, the fluid material separates cleanly, and there are fewer fluctuations in the shape and the remaining amount of the remaining fluid material 17.

It is preferable that either the portion AA, or the area of the portion BB in contact with the above fluid material, or both, have a surface formed with at least one of the following characteristics: roughness, depressions, protrusions, depressions and protrusions, linear depressions, linear protrusions, or linear depressions and protrusions. This is in order that fluid material adhering to the surface can be more easily extracted outside the nozzle when the filament-shape member 14 moves from the nozzle interior to outside the nozzle.

Figure 10:
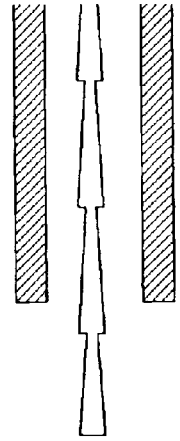
FIG. 10 shows a cross-sectional construction of part of still another filament-shape member having a construction in which upward-pointing truncated cones are overlapped from the bottom upward.
Figure 4:
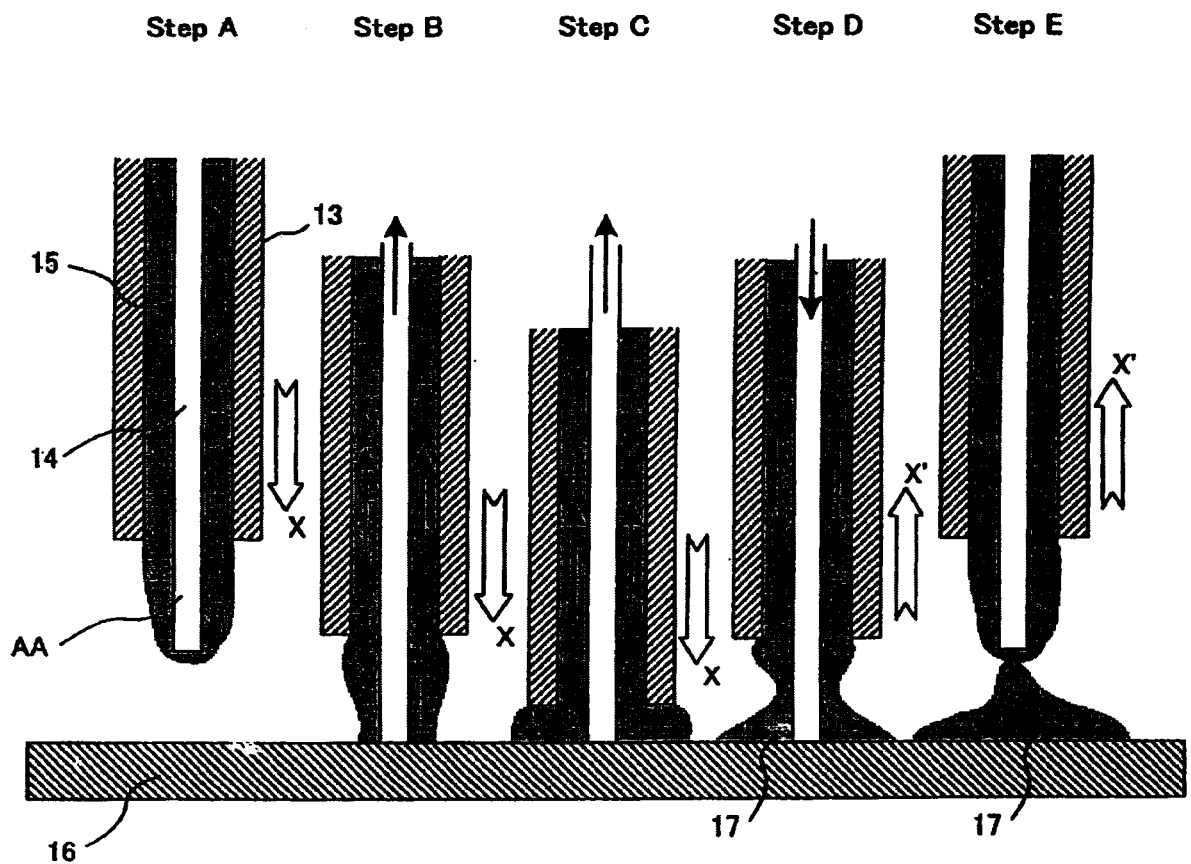

In particular, the effect brought about by the shape as shown in the case of FIG. 10 that when the filament-shape member 14 moves from within the nozzle to outside the nozzle, a large shear stress acts, making it easy to push the fluid material adhering to the surface outside the nozzle, while making it less easy to push the fluid material when the filament-shape member 14 moves in the opposite direction, can improve the discharge of the fluid material.

However, even without such a construction, if the above-described roughness, depressions, protrusions, depressions and protrusions, linear depressions, linear protrusions, or linear depressions and protrusions are present, fluid material adhering to the surface of the filament-shape member 14 is more easily extracted to outside the nozzle. This is inferred to occur because the fluid material has a certain level of viscosity, and often has thixotropic properties. The appropriate heights and depths of the roughness, depressions, and protrusions can be determined by trial-fabrication of filament-shape members and testing.

While, in the above aspect, normally the nozzle 13 and filament-shape member 14 are positioned such that their circular cross-sections are concentric, concentric-circular cross-section is not an indispensable factor.

Also, contact between the inner walls of the nozzle 13 and the filament-shape member 14 often will not pose a problem.

More specifically, if a particularly large force is not required when the tip of the filament-shape member 14 is pressed against the adherend 16, then often there are no problems with operation, and virtually no problems with variations in the amount of discharge of the fluid material.

When utilizing a bent construction as in this invention, there may be a case that while the inner walls of the nozzle 13 and the filament-shape member 14 are not mutually in contact initially, the inner walls of the nozzle 13 and the filament-shape member 14 come into mutual contact when the tip of the filament-shape member 14 is pressed against the adherend 16. However, this, also, often poses no problems.

When considering a common case in which the nozzle 13 and filament-shape member 14 are positioned such that the circular cross-sections are concentric, it is desirable that the angle of bending of the portion CC be in the range 90°±10°.

By choosing such a value, excessive force is not required when pressing the tip of the filament-shape member 14 against the adherend 16, no excessive bending stress is brought to bear against the filament-shape member, and reliability can be maintained over a long period of time.

It is preferable that the relation between the inner diameter of the nozzle 13 and the cross-section of the filament-shape member 14 be such that, for at least the area of the portion BB in contact with the above fluid material and which is not the narrow tip and for the above nozzle, the cross-sections perpendicular to the nozzle direction (the cross-sectional areas $S_B$ and $S_N$, respectively) satisfy $0.3 \leq S_B/S_N \leq 0.7$. If $0.7 < S_B/S_N$, the shear stress acting on the fluid material during the discharge of fluid material is large, and too much time is required for the return of the filament-shape member 14 into the nozzle 13; if $S_B/S_N < 0.3$, the shear stress acting on the fluid material is small, and there is a tendency for variations in the amount of discharge to occur.

In order to smoothly extract the fluid material, it is preferable that there be a certain level of affinity between the filament-shape member and the fluid material.

This invention is particularly suitable for application when the viscosity of the fluid material is in the range 10 Pa·s to 100 Pa·s. This is because, if the viscosity is too high, it becomes difficult to secure discharge of the fluid material; if the viscosity is too low, there is the possibility that the amount of discharge of the fluid material will fluctuate.

In this invention, "fluid material" includes, in addition to ordinary liquids, materials in a sol state, pastes in which solids, other liquids, or other materials are dispersed in a liquid, suspensions, and emulsions.

In the above, the fluid material is discharged solely through the movement of the filament-shape member; however, by virtue of the simple construction in this invention, the discharge device can also be provided with a pressurizing device for discharge of the fluid material via the nozzle.

In this case, together with the advantage of improved control over discharge amounts and less variation in discharge amounts, it is easier to realize such other advantages as reduction or prevention of the above-described inadequate discharges.

In particular, when a pressurizing device is also provided, the function of the filament-shape member can be used principally to prevent the partial clogging or increase in viscosity of the fluid material by imparting fluidity to the fluid material through the motion of the filament-shape member, while the function of the pressurizing device can be utilized for discharge of fluid material. Hence a discharge device with better control of discharge amounts and less variation in discharge amounts can easily be obtained, without difficulties relating to the size of the gap between the nozzle and the filament-shape member.

This invention can be applied in cases where a semiconductor chip or other electronic device is to be bonded to a lead frame or substrate; where electronic components are to be bonded together; where lubricants or sealing agents are to be applied; and in other areas.

As the fluid material used, silver paste or other conductive paste, resistive paste, insulating paste, epoxy resin, grease, sealing materials, and other materials may be used.

Below, one embodiment of this invention is described.

A fluid material discharge device such as that shown in FIG. 11 was assembled.

First, a fluid material holder 20 with nozzle, like that shown in FIG. 11, was prepared. This fluid material holder 20 was of plastic, with a circular cross-section of diameter 12.6 mm, and volume 5 mL.

This fluid material holder 20 had a depression (not shown) such as that in FIG. 6.

The nozzle 21 was of stainless steel, with a circular cross-section, having an outer diameter of 0.81 mm and an inner diameter of 0.51 mm.

Separately, a filament-shape member 22 of steel wire, with a circular cross-section of diameter 0.2 mm, having a portion CC with a coil-spring type structure as shown in FIG. 5, and with the portion CC bent 90° from the portion BB, was prepared.

This filament-shape member 22 was inserted into the fluid material holder in the direction from the top of the plane of FIG. 11 downwards, using an insertion jig of FIG. 12, and was held by the above-described depression.

In this state, the length of the portion corresponding to the tip portion AA of the filament-shape member 22 was 1.5 mm.

This tip portion had a conical-shape taper with a taper angle of 30°, as shown in FIG. 8.

The above fluid material discharge device was used to dispense a silver paste of viscosity 45 Pa·s (as measured with an E-type viscometer), at a rate of 4 mg/cycle and a speed of 120 cycles/minute, while applying air pressure at 1520 hPa (absolute pressure) as necessary from the upper portion of the fluid material holder by means of a pressurizing device, not shown. As the pressurizing device, any well-known device can be used.

As a result of operations to bond piezoelectric chips to substrates using this device, it was confirmed that in 100,000 cycles there were zero discharge failures, including those of no discharge and discharge amount shortages of 20% or more.

In this invention, as explained above, it is easy to adjust the fluid material discharge amount, so that there is the further advantage that the distance between nozzle and adherend need not be controlled so rigorously as in the prior art.

That is, in conventional methods often the discharge amount is controlled by how close the nozzle is brought to the adherend; if brought too close, the nozzle and adherend may be damaged, and if held too far away, application failures (insufficient discharge amounts) may occur. However, using the technique of this invention, the discharge amount can easily be adjusted through the selection of the material and shape of the filament-shape member, and through use of the discharge device together with a pressurized gas, so that the above problem can be alleviated.

In particular, by combining use with a pressurizing device as described above, a discharge device with improved discharge amount control and with less variation in discharge amounts can easily be obtained, so that discharge amount adjustment also becomes easier.

The present invention is particularly effective when bonding a semiconductor chip or other electronic device to a lead frame or substrate, when bonding electronic components together, and when applying lubricants or sealing agents. This invention is also particularly suitable for applications requiring a capacity of from 10 to 180 cycles/minute and 1 to 20 mg/cycle.

By means of the present invention, a technique can be provided for fluid material discharge with few or no inadequate discharges.

Further, by means of this invention a fluid material discharge device of simple construction can be provided.

Also, by means of this invention a technique for fluid material discharge with high productivity, that is, requiring less time per discharge cycle, can be provided.

Further, by means of this invention a technique for fluid material discharge can be provided which enables easy modification and adjustment of the amount of fluid material discharged.

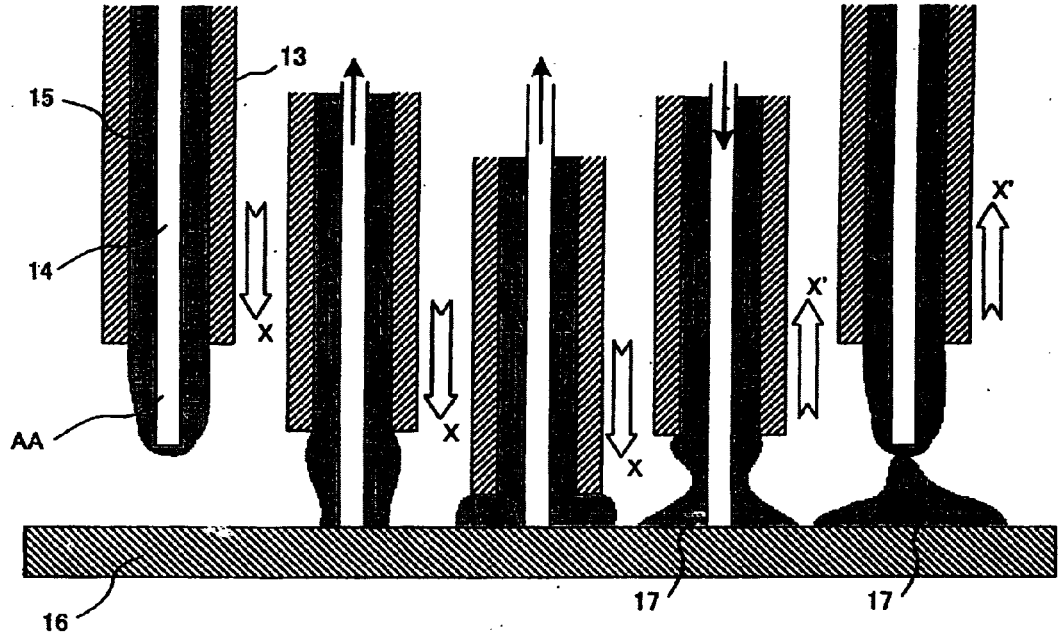

What is claimed is:

1. A fluid material discharge device, comprising a nozzle for discharge of fluid material and a filament-shape member inserted into the nozzle for use, wherein said filament-shape member comprises:
   a tip portion AA, which is exposed outside the nozzle when no pressure is exerted on the tip of the filament-shape member;
   a portion BB which is configured to be inserted in the nozzle, and when the portion BB is inserted in the nozzle and tip portion AA is exposed outside the nozzle, the portion BB is further configured to allow the fluid material to pass in the nozzle; and,
   a portion CC, on the side of the filament-shape member opposite the tip portion AA, and being bent from the portion BB.

2. The discharge device according to claim 1, wherein said portion CC has a coil-spring structure.

3. The discharge device according to claim 2, wherein said portion AA has a tapered portion.

4. The discharge device according to claim 2, wherein said filament-shape member is formed from an elastic body.

5. The discharge device according to claim 4, wherein said elastic body is glass fiber, carbon fiber, or steel wire.

6. The discharge device according to claim 5, wherein, of said filament-shape member, either the portion AA or an area of the portion BB in contact with said fluid material, or both, have a surface formed with at least one of the characteristics selected from the group consisting of depressions, protrusions, depressions and protrusions, linear depressions, linear protrusions, and linear depressions and protrusions.

7. The discharge device according to claim 6, further comprising said fluid material, wherein the viscosity of said fluid material is between 10 Pa·s and 100 Pa·s.

8. The discharge device according to claim 7, further comprising a fluid material holder connected to said nozzle, and comprising a depression portion in an inner wall of the fluid material holder, to fix in place said portion CC.

9. The discharge device according to claim 8, wherein said discharge device comprises a pressurizing device to discharge fluid material via said nozzle.

* * * * *

UNITED STATES PATENT AND TRADEMARK OFFICE
CERTIFICATE OF CORRECTION

| | |
|---|---|
| PATENT NO. | : 6,960,258 B2 |
| APPLICATION NO. | : 10/267667 |
| DATED | : November 1, 2005 |
| INVENTOR(S) | : Kikuchi |

It is certified that error appears in the above-identified patent and that said Letters Patent is hereby corrected as shown below:

The title page showing the illustrative figure should be deleted to be replace with the attached title page.

The drawing sheet, consisting of Fig. 4, should be deleted to be replaced with drawing sheet, consisting of Fig. 4, as shown on the attached page.

Signed and Sealed this

Seventh Day of November, 2006

JON W. DUDAS
*Director of the United States Patent and Trademark Office*

United States Patent
Kikuchi

(10) Patent No.: US 6,960,258 B2
(45) Date of Patent: Nov. 1, 2005

(54) DISCHARGE DEVICE AND DISCHARGE METHOD

(75) Inventor: Katsumi Kikuchi, Aomori (JP)

(73) Assignee: Fujitsu Media Devices Limited, Yokohama (JP)

(*) Notice: Subject to any disclaimer, the term of this patent is extended or adjusted under 35 U.S.C. 154(b) by 279 days.

(21) Appl. No.: 10/267,667

(22) Filed: Oct. 10, 2002

(65) Prior Publication Data
US 2003/0089795 A1 May 15, 2003

(30) Foreign Application Priority Data
Nov. 9, 2001 (JP) .................................. 2001-344083

(51) Int. Cl.⁷ .................................................. B65D 5/72
(52) U.S. Cl. ...................... 118/200; 222/501; 401/148
(58) Field of Search ......................... 118/222, 200, 118/205, 300; 222/501, 518; 401/148

(56) References Cited
U.S. PATENT DOCUMENTS 4,461,408 A * 7/1984 Shepard ...................... 222/501
4,812,071 A * 3/1989 Batra et al. .................. 401/264

* cited by examiner

Primary Examiner—Fred J. Parker
(74) Attorney, Agent, or Firm—Arent Fox PLLC

(57) ABSTRACT

By means of a fluid material discharge device of simple construction, a technique for fluid material discharge is provided which has few or no inadequate discharge, high productivity, and which enables easy modification and adjustment of the amount of fluid material discharge. The fluid material discharge device comprises a nozzle for discharge of fluid material and a filament-shape member inserted into the nozzle for use. The filament-shape member has a tip portion AA, which is exposed outside of the nozzle when no pressure is exerted on the tip of the filament-shape member, a portion BB which can be inserted into the nozzle, and a portion CC, on the side of the filament-shape member opposite the tip portion AA, and being bent from the portion BB. The spring structure of the filament-shape member is utilized to discharge fluid material.

9 Claims, 7 Drawing Sheets